US011651968B2

(12) United States Patent
Lee et al.

(10) Patent No.: US 11,651,968 B2
(45) Date of Patent: May 16, 2023

(54) METHOD FOR FORMING PLANARIZATION LAYER AND PATTERN FORMING METHOD USING THE SAME

(71) Applicant: SK hynix Inc., Gyeonggi-do (KR)

(72) Inventors: Ji Sok Lee, Gyeonggi-do (KR); Sung Koo Lee, Gyeonggi-do (KR); Jae Hee Sim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 232 days.

(21) Appl. No.: 17/082,535

(22) Filed: Oct. 28, 2020

(65) Prior Publication Data

US 2021/0375632 A1 Dec. 2, 2021

(30) Foreign Application Priority Data

May 26, 2020 (KR) .......................... 10-2020-0062914

(51) Int. Cl.
*H01L 21/3105* (2006.01)
*H01L 21/033* (2006.01)
(52) U.S. Cl.
CPC .... *H01L 21/31051* (2013.01); *H01L 21/0337* (2013.01); *H01L 21/31058* (2013.01); *H01L 21/0334* (2013.01)

(58) Field of Classification Search
CPC ........... H01L 21/31051; H01L 21/0337; H01L 21/31058; H01L 21/0334
See application file for complete search history.

(56) References Cited

U.S. PATENT DOCUMENTS

| 8,263,487 | B2 | 9/2012 | Yoon et al. | |
|---|---|---|---|---|
| 2007/0128355 | A1 | 6/2007 | Jung | |
| 2008/0069948 | A1 | 3/2008 | Yoshihara et al. | |
| 2014/0131312 | A1* | 5/2014 | Chang | H01L 21/0337 216/49 |
| 2015/0348828 | A1* | 12/2015 | Sim | H01L 21/76224 438/781 |
| 2021/0104669 | A1* | 4/2021 | Park | H01L 45/126 |

* cited by examiner

*Primary Examiner* — Victor A Mandala
*Assistant Examiner* — Colleen E Snow
(74) *Attorney, Agent, or Firm* — IP & T Group LLP

(57) ABSTRACT

A method for forming a planarization layer includes: providing a substrate including a trench; coating a pre-thinner over a surface of the trench; forming a gap-filling material in the trench; coating a post-thinner over the gap-filling material; and performing a spinning process to rotate the substrate.

17 Claims, 26 Drawing Sheets

METHOD FOR FORMING PLANARIZATION LAYER AND PATTERN FORMING METHOD USING THE SAME

CROSS-REFERENCE TO RELATED APPLICATIONS

The present application claims priority to Korean Patent Application No. 10-2020-0062914, filed on May 26, 2020, which is incorporated herein by reference in its entirety.

BACKGROUND

1. Field

Various embodiments of the present invention relate to a method for fabricating a semiconductor device and, more particularly, to a method for forming a planarization layer. Various embodiments of the present invention also relate to a method for forming a pattern using the planarization layer forming method.

2. Description of the Related Art

A plurality of patterns are formed during a process for fabricating a semiconductor device. With a general photolithography process, there is a limit in minimizing the critical dimension of the pattern. Therefore, there is a need to develop new methods for realizing a critical dimension that exceeds the critical resolution of photolithography.

Moreover, when a gap-filling material is used to fill gaps between patterns, the addition of the gap-filling material may be formed unevenly according to the position or pattern on the wafer. For example, when a gap-filling material is applied as a hard mask or the like, a problem may occur when patterning a lower portion due to a difference in thickness between patterns.

SUMMARY

Various embodiments of the present invention are directed to a method for forming a planarization layer. The method improves the planarization characteristics of a gap-filling material. The method may include applying a thinner coating before and after forming the gap-filling material. Various embodiments of the present invention are also directed to a method for forming a pattern by using the planarization layer forming method.

In accordance with an embodiment of the present invention, an improved method for forming a planarization layer is provided. The method includes: providing a substrate including a trench; coating a pre-thinner over a surface of the trench; forming a gap-filling material in the trench; coating a post-thinner over the gap-filling material; and performing a spinning process to rotate the substrate.

In accordance with another embodiment of the present invention, a method for forming a pattern includes: forming first lines over an etch target material; forming a gap-filling material between the first lines, an upper surface of the gap-filling material being positioned at a higher level than an upper surface of at least the first lines; forming second lines in a direction intersecting with the first lines by etching the gap-filling material; gap-filling a hard mask having an upper surface positioned at the same level as at least the first lines between the second lines; etching the second lines and the first lines exposed by the hard mask; removing the second lines; and forming a plurality of island-shaped openings separated from each other by etching the etch target material with the first lines and the hard mask, wherein a thinner coating is formed before and after the forming of the gap-filling material.

In accordance with another embodiment of the present invention, a method for forming a planarization layer includes: forming a trench in a substrate; applying a first thinner over the substrate and a surface of the trench; forming a gap-filling material over the first thinner in the trench; performing a spinning process to rotate the substrate and planarize the gap-filling material, and removing the first thinner.

These and other features and advantages of the present invention will become understood by those with ordinary skill in the art of the invention from the following detailed description and drawings.

DETAILED DESCRIPTION

Figure 1A:
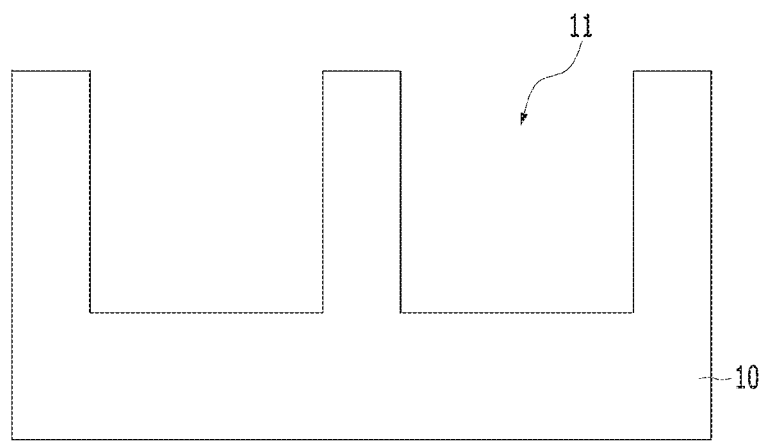
FIGS. 1A to 1F are cross-sectional views illustrating a method for forming a planarization layer in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

It should be understood that the drawings are simplified schematic illustrations of the described devices and may not include well known features in order not to obscure features of the present invention. Further, one embodiment may be used with one or more features of another embodiment without departing from the scope of the invention. FIGS. 1A to 1F are cross-sectional views illustrating a method for forming a planarization layer in accordance with an embodiment of the present invention.

Referring to FIG. 1A, a trench 11 may be formed in a substrate 10. The trench 11 may be formed by forming a stacked structure of a etch target layer and a mask pattern or forming a mask pattern over the substrate 10 and etching the etch target layer or the substrate 10 by using the mask pattern as an etch mask. The trench 11 may be formed by etching the substrate 10 or, alternatively, in a variation of the illustrated embodiment, the trench 11 may be formed by etching the etch target layer formed over the substrate 10. Hereinafter, it is described in the embodiment of the present invention that the trench 11 is formed in the substrate 10.

The trench 11 may include an open portion of a type, such as a line type, a mesh type, or a hole type when viewed from the top. That is, a line type trench 11 may include a plurality of line type gaps formed in the substrate 10 which are not connected to each other. In another example, a mesh type trench 11 may include a first plurality of parallel line gaps extending in a first direction and a second plurality of parallel line gaps extending in a second direction intersecting with the first direction to form a mesh when viewed from the top. The first and second directions may be perpendicular to each other. A hole type trench 11 may include a plurality of holes, each hole extending in a third direction. The third direction may be a direction vertical to the top surface of the substrate 10. The third direction may be the direction of the stacking.

Figure 1B:
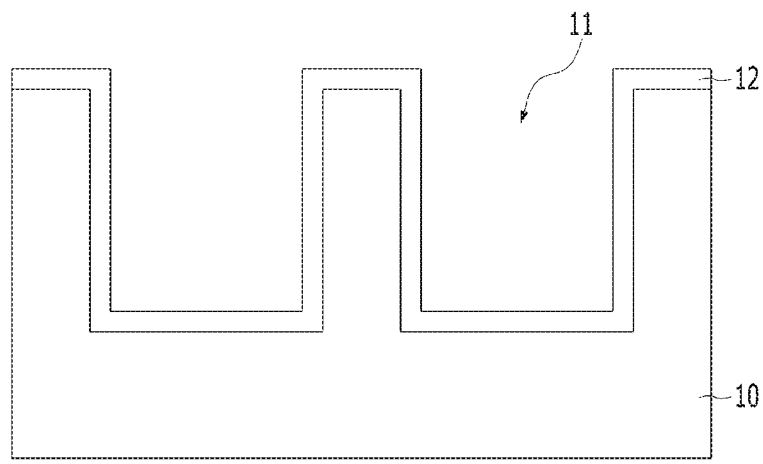

Referring to FIG. 1B, the upper portion of the trench 11 may be coated with a pre-thinner 12. The pre-thinner 12 may serve to improve the planarization characteristics of the gap-filling material formed in the trench 11 in a subsequent operation. The pre-thinner 12 may coat the overall profile of the substrate 10 including the trench 11. The pre-thinner 12 may be formed, for example, of a combination of propylene glycol methyl ether acetate (PGMEA) and propylene glycol methyl ether (PGME). The pre-thinner 12 may further include additives, such as, for example, cyclopentanone (CPN), methyl-3-methoxy propionate (MMP), gamma butyrolactone (GBL), and ethoxy ethyl propionate (EEP). The pre-thinner 12 may be easily removed in the subsequent baking process, and its thickness may be adjusted to facilitate gap-filling of the gap-filling material. The pre-thinner 12 may be applied for approximately 0.1 second to 3 seconds.

Figure 1C:
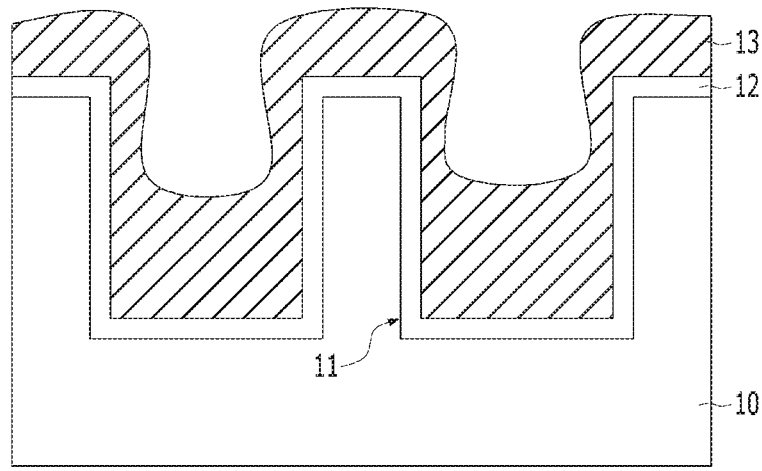

Referring to FIG. 1C, a gap-filling material 13 may be formed in the trench 11. The gap-filling material 13 may be formed by, for example, spin coating. The gap-filling material 13 may include, for example, a carbon-containing material, and it may include all materials that may gap-fill the inside of the trench 11 and have its planarization characteristics improved by a thinner. The carbon-containing material may include, for example, Spin On Carbon (SOC) or photoresist, but the concept and spirit of the present invention are not limited thereto. For example, the SOC may have a viscosity of approximately 1 to 4 CP (centipoise), and the spinning speed of the substrate 10 for forming the SOC may be adjusted to approximately 0.1 RPM to 3000 RPM. The thickness and gap-filling time of the gap-filling material 13 may be adjusted according to the depth of the trench 11. The gap-filling material 13 may be formed, for example, for approximately 0.1 second to 5 seconds.

Figure 1D:
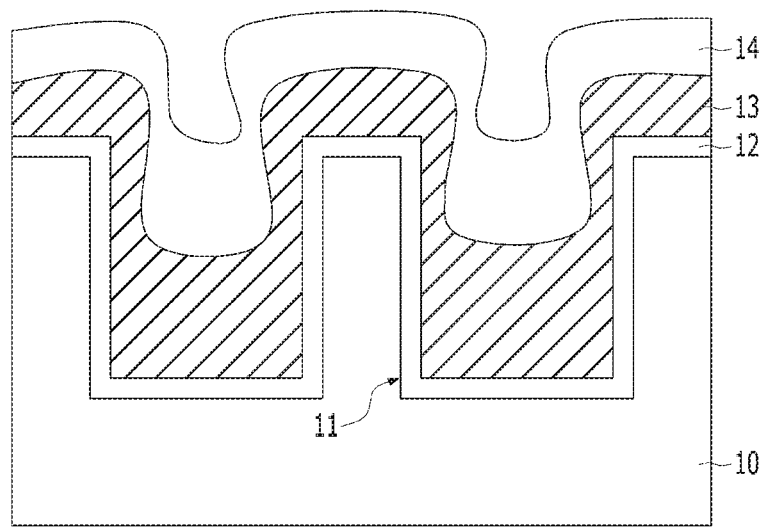

Referring to FIG. 1D, a post-thinner 14 may be formed over the gap-filling material 13. The post thinner 14 is for improving the planarization characteristics of the gap-filling material 13 and may serve to increase torque in the subsequent spinning process. The post thinner 14 may be formed of the same material as that of the pre-thinner 11. The post thinner 14 may be adjusted to a thickness that may increase the torque during the subsequent spinning process without remaining over the gap-filling material 13 during the subsequent baking process. The post thinner 14 may be sprayed onto the upper portion of the gap-filling material 13. The post thinner 14 may be applied in, for example, an amount of approximately 0.1 cc (cubic centimeters) to 5 cc.

Figure 1E:
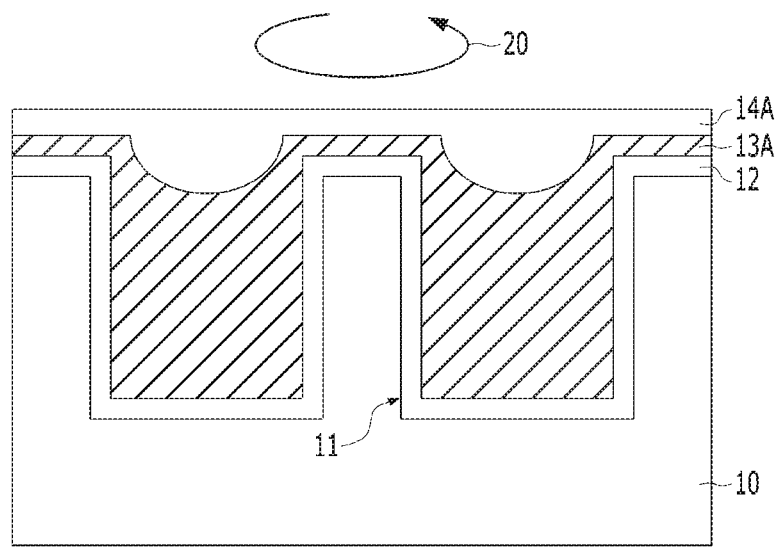

Referring to FIG. 1E, a spinning process 20 may be performed onto the substrate 10 to planarize the gap-filling material 13 and form the gap filling 13A. Also, the post thinner 14 becomes post thinner 14A after the spinning process 20. The spinning speed of the substrate 10 may be adjusted to an extent that the gap-filling material 13 outside the trench 11 migrates into the trench 11 to maximize the planarization characteristics of the gap-filling material 13 and forms the gap filing material 13A. The spinning process of the substrate 10 may be performed at a rate of, for example, approximately 10 RPM to 3000 RPM.

Figure 1F:
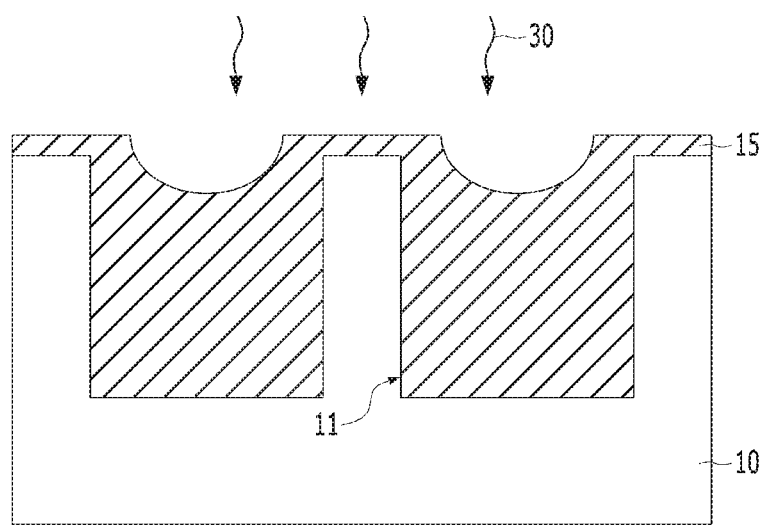

Referring to FIG. 1F, a baking process 30 may be performed. The baking process 30 may be performed to remove the pre-thinner 12 (see FIG. 1E) and the post thinner 14A (see FIG. 1E). The thinners 12 and 14A may be all removed by the baking process 30 so that only the planarization layer 15 may remain in the trench 11. The baking process 30 may be performed at a temperature of, for example, approximately 0° C. to 400° C.

As described above, according to the embodiment of the present invention, a higher torque may be obtained and a planarization layer 15 having improved planarization characteristics may be formed regardless of the shape of the pattern or the position on the wafer by applying a thinner (pre-thinner 12 and post thinner 14) before and after forming the gap-filling material 13, compared to a case when only the gap-filling material 13 is formed.

Therefore, when the planarization layer 15 is applied as a hard mask, the margin of an etching process may be increased. That is, since it has a uniform thickness regardless of the position on the wafer, patterning of the hard mask is easy, and the etching process can be performed under uniform etching conditions when etching a lower layer. Also, when a hard mask is applied onto the upper portion of the planarization layer 15, a focus margin for patterning the hard mask may be increased due to the planarization of the lower portion.

FIGS. 2A to 2I are plan views illustrating a pattern forming method in accordance with an embodiment of the present invention. FIGS. 3A to 11D are cross-sectional views illustrating a pattern forming method in accordance with an embodiment of the present invention.

Figure 2A:
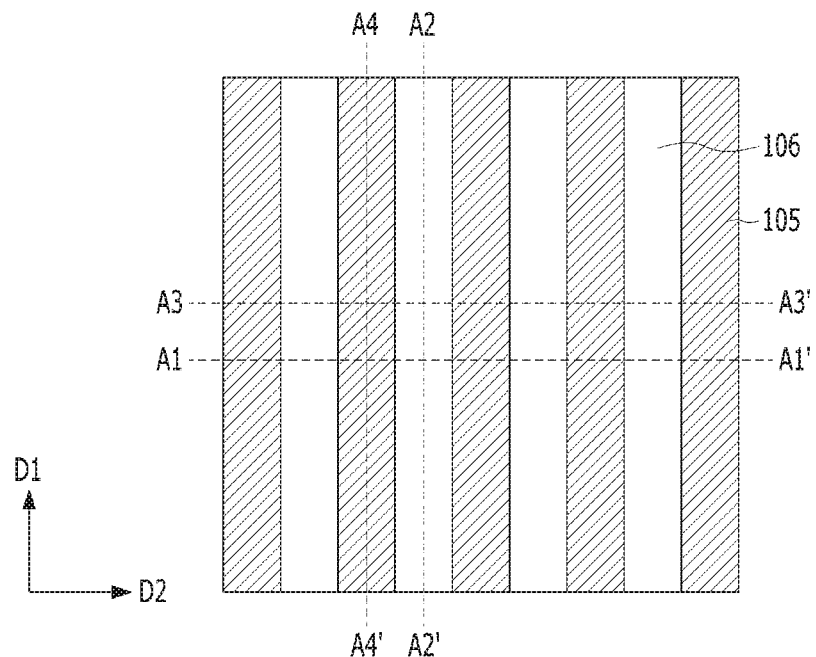
FIGS. 2A to 2I are plan views illustrating a pattern forming method in accordance with an embodiment of the present invention.
Figure 3A:
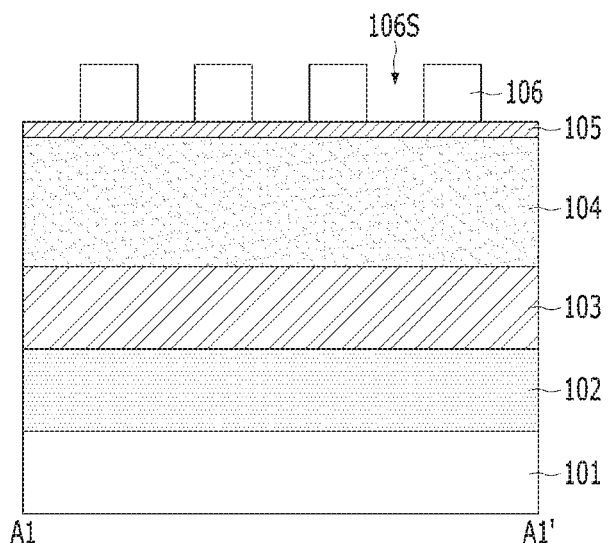
FIGS. 3A to 11D are cross-sectional views illustrating a pattern forming method in accordance with an embodiment of the present invention.
Figure 3B:
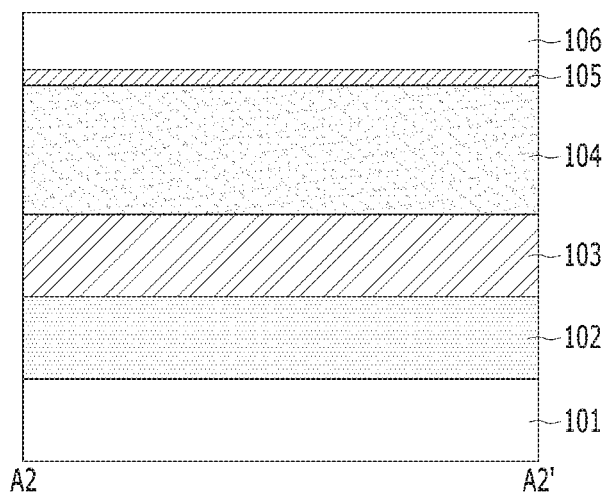
Figure 3C:
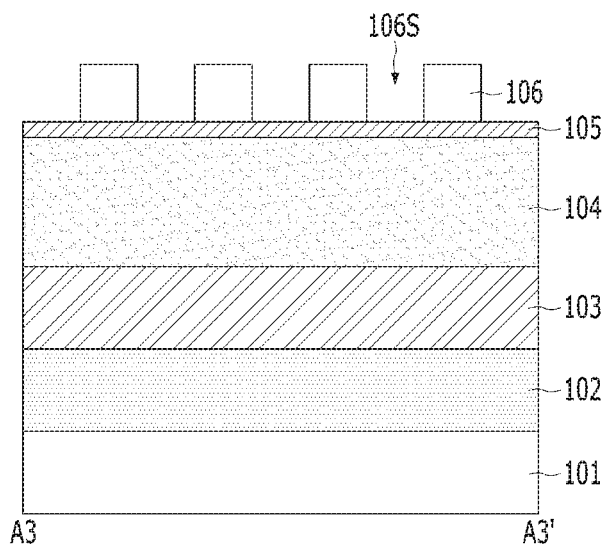
Figure 3D:
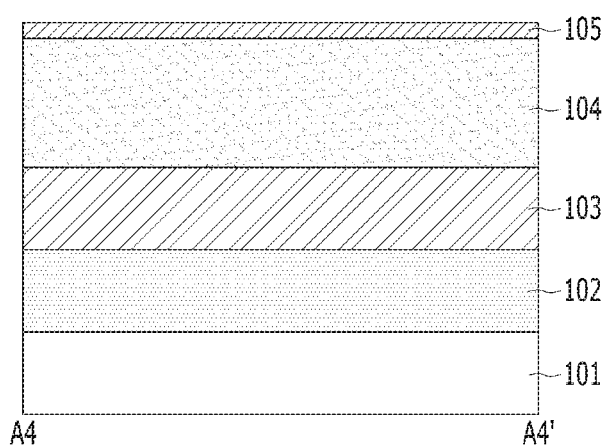

FIG. 3A is a cross-sectional view taken along a line A1-A1' of FIG. 2A, and FIG. 36 is a cross-sectional view taken along a line A2-A2' of FIG. 2A. FIG. 3C is a cross-sectional view taken along a line A3-A3' of FIG. 2A, and FIG. 3D is a cross-sectional view taken along a line A4-A4' of FIG. 2A.

As illustrated in FIGS. 2A, 3A, 3B, 3C, and 3D, an etch target material 102 may be formed over the substrate 101. The substrate 101 may be a material suitable for semiconductor processing. The substrate 101 may include a semiconductor substrate, a dielectric layer, a conductive layer, a semiconductor layer, or a combination thereof. The substrate 101 may include a silicon substrate, a silicon germanium substrate, an SOI substrate, or a compound semiconductor substrate. The etch target material 102 may be a single layer or a multi-layer. The etch target material 102 may include a dielectric layer, a conductive layer, a semiconductor layer, or a combination thereof. The etch target material 102 may include, for example, silicon oxide, silicon nitride, polysilicon, metal, or a combination thereof.

A first hard mask material 103 may be formed over the etch target material 102. See FIG. 3A. The first hard mask material 103 may have an etch selectivity with respect to the etch target material 102. The first hard mask material 103 may include, for example, silicon oxide. According to the embodiment of the present invention, the first hard mask material 103 may be Undoped Silicate Glass (USG).

A first sacrificial material 104 may be formed over the first hard mask material 103, The first sacrificial material 104 may have an etch selectivity with respect to the first hard mask material 103. In other words, the first sacrificial material 104 may serve as an etch barrier during the etching process of the first hard mask material 103. The first sacrificial material 104 may include, for example, a nitride, an oxide, carbon, an anti-reflection coating layer (ARC), polysilicon, spin on carbon (SOC), or a combination thereof. The first sacrificial material 104 may be a multi-layer formed of different materials. The first sacrificial material 104 may serve as an etch barrier during the etching process of the first hard mask material 103. The upper surface of the first sacrificial material 104 may be planar. The first sacrificial material 104 may be formed by a spin on coating process. The first sacrificial material 104 may be formed, for example, of a carbon-containing material. For example, the first sacrificial material 104 may include a carbon material (SOC) formed by spin on coating. The carbon-containing material may have an etch selectivity with respect to silicon oxide.

A first mask material 105 may be formed over the first sacrificial material 104. The first mask material 105 may have an etch selectivity with respect to the first sacrificial material 104. The first mask material 105 may include, for example, oxynitride. The first mask material 105 may include silicon oxynitride (SiON). The first mask material 105 may be thinner than the first sacrificial material 104.

A plurality of first photoresist patterns 106 may be formed over the first mask material 105. The first photoresist patterns 106 may be formed by applying a photoresist onto the first mask material 105 and performing exposure and development. The first photoresist patterns 106 may have a line/space shape. The first photoresist patterns 106 may have a linear shape extending in one direction D1. A plurality of first spacings 106S may be defined between the first photoresist patterns 106, and the surface of the first mask material 105 may be partially exposed by the first spacings 106S. The first spacings 106S may have a linear shape extending in one direction.

Figure 2B:
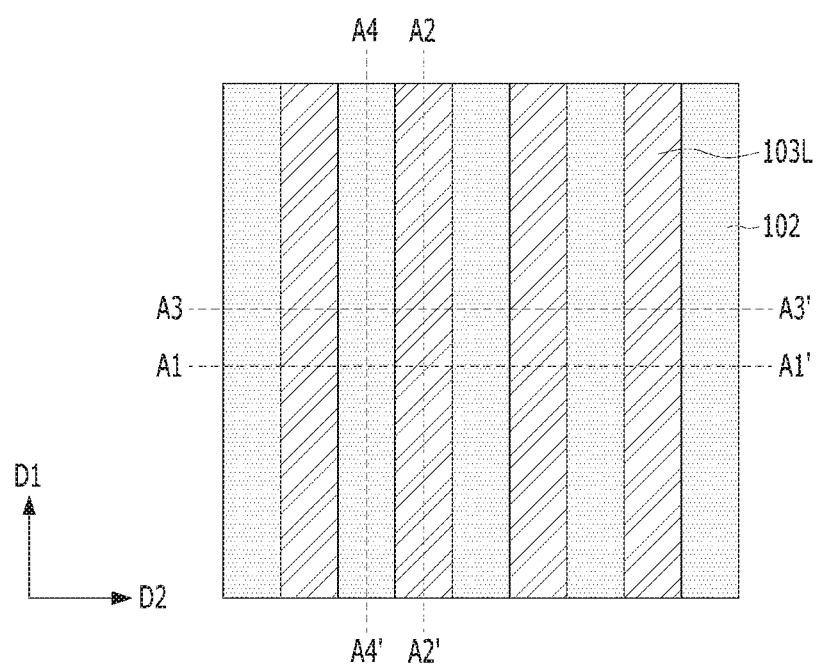
Figure 4A:
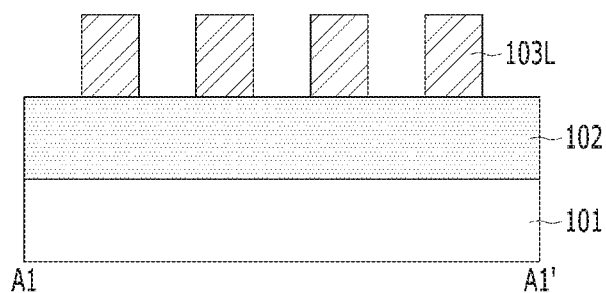
Figure 4B:
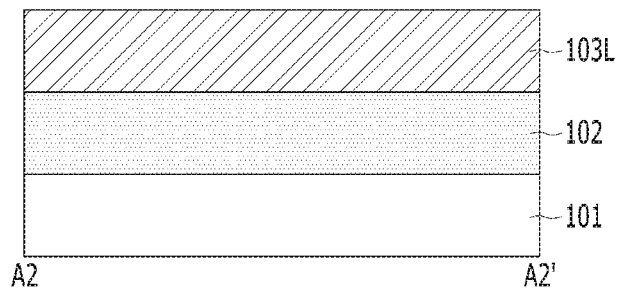
Figure 4C:
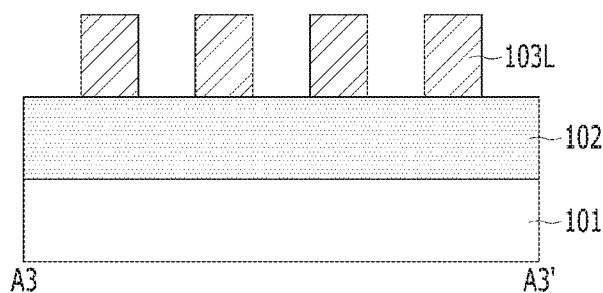
Figure 4D:
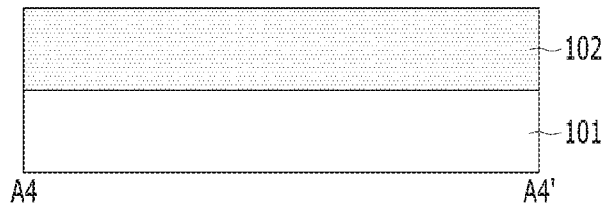

FIG. 4A is a cross-sectional view taken along a line A1-A1' of FIG. 2B, and FIG. 4B is a cross-sectional view taken along a line A2-A2' of FIG. 2B. FIG. 4C is a cross-sectional view taken along a line A3-A3' of FIG. 2B, and FIG. 4D is a cross-sectional view taken along a line A4-A4' of FIG. 2B.

Referring to FIGS. 2B, 4A, 4B, 4C, and 4D, a plurality of spaced apart parallel first lines 103L may be formed. The first lines 103L may be formed by etching the first hard mask material 103. In order to form the first lines 103L, the first mask material 105, the first sacrificial material 104, and the first hard mask material 103 may be sequentially etched. The etched upper layer may be used as an etch mask for etching each lower layer. That is, the first mask material 105 may be etched using the first photoresist patterns 106 as an etch mask, and the first sacrificial material 104 may be etched using the etched first mask material 105, and the first hard mask material 103 may be etched using the etched first sacrificial material 104.

The first lines 103L may have a linear shape extending in a first direction D1, The first lines 103L may have a line/space shape. A plurality of spacings may be defined between the first lines 103L, and a surface of the etch target material 102 may be partially exposed by the spacings.

After the first lines 103L are formed, the first photoresist patterns 106, the first mask material 105, and the first sacrificial material 104 may be removed. The first photoresist patterns 106, the first mask material 105, and the first sacrificial material 104 may be partially missed in the process of etching the respective lower layers, and when they remain, they may be removed through a stripping process.

Figure 2C:
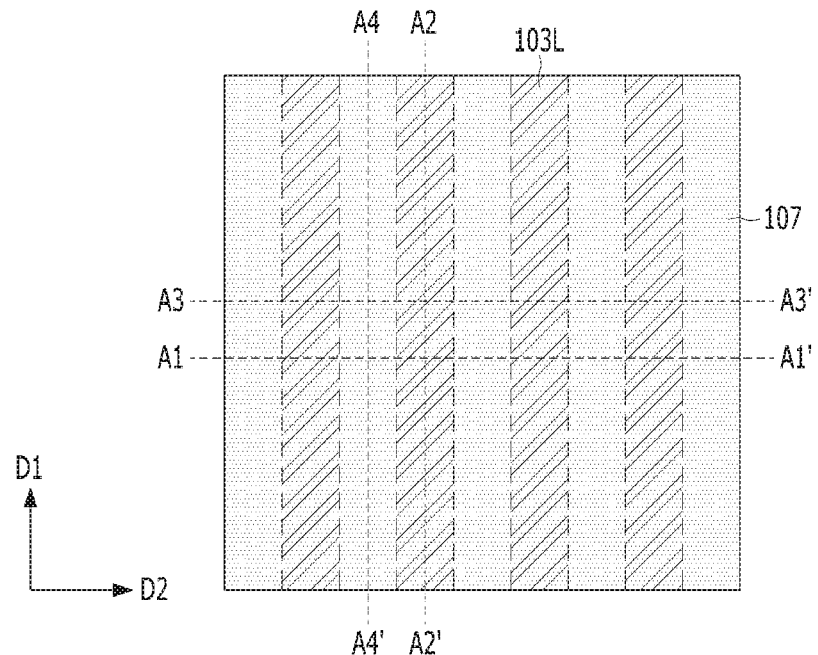
Figure 5A:
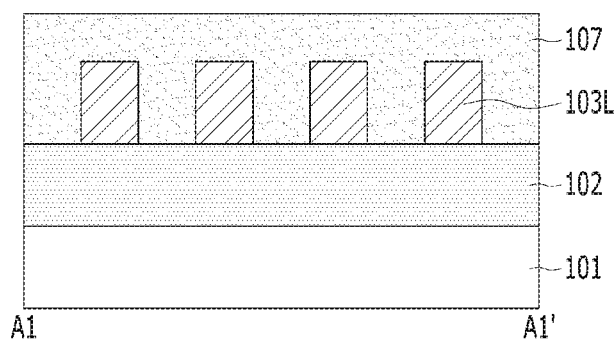
Figure 5B:
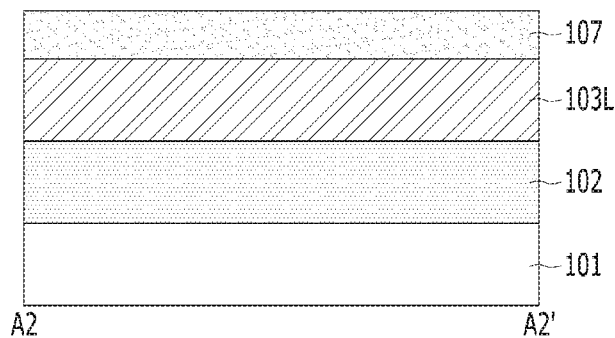
Figure 5C:
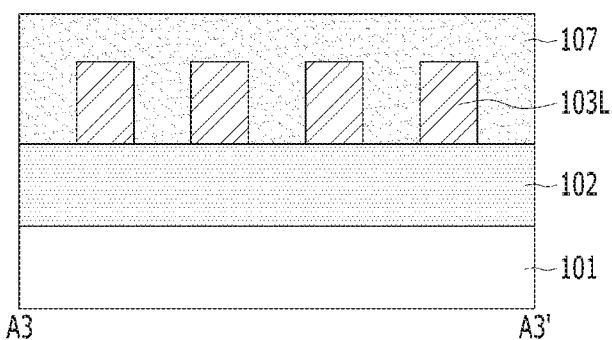
Figure 5D:
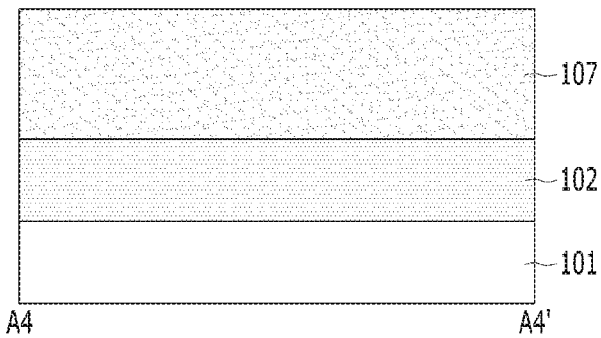

FIG. 5A is a cross-sectional view taken along a line A1-A1' of FIG. 2C, and FIG. 5B is a cross-sectional view taken along a line A2-A2' of FIG. 2C. FIG. 5C is a cross-sectional view taken along a line A3-A3' of FIG. 2C, and FIG. 5D is a cross-sectional view taken along a line A4-A4' of FIG. 2C.

Referring to FIGS. 2C, 5A, 5B, 5C, and 5D, a second sacrificial material 107 for gap-filling the spacings between the first lines 103L may be formed. The second sacrificial material 107 may be formed to have an upper surface positioned at a higher level than at least the upper surface of the first lines 103L. The second sacrificial material 107 may fill the spacing between the first lines 103L without voids.

To this end, the process of forming the second sacrificial material 107 may be performed by a method of forming a planarization layer in accordance with the embodiment of the present embodiment illustrated in FIGS. 1A to 1F. The process of forming the second sacrificial material 107 may include performing a thinner coating process before and after gap-filling the second sacrificial material 107 between the first lines 103L, and removing the formed coated thinners (pre-thinner and post thinner) through the spinning and baking processes.

Therefore, the upper surface of the second sacrificial material 107 may be formed to be planar. The second sacrificial material 107 and the first sacrificial material 104 may be formed of the same material. The second sacrificial material 107 may be formed by spin-on coating. The second sacrificial material 107 may be formed of a carbon-containing material. The second sacrificial material 107 may include spin-on carbon (SOC).

Figure 2D:
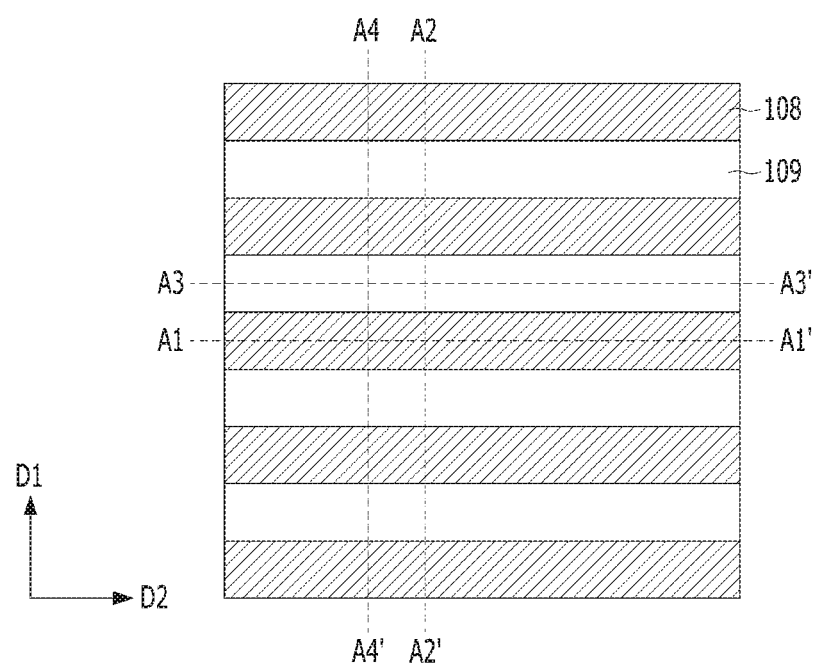
Figure 6A:
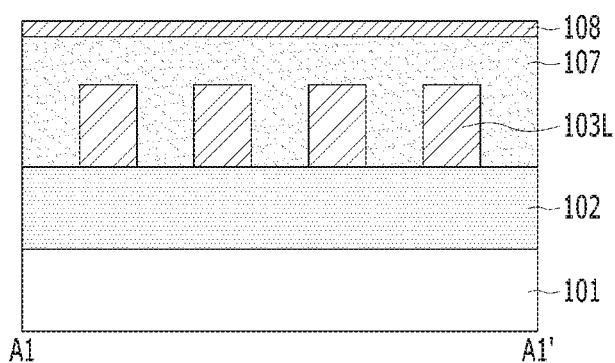
Figure 6B:
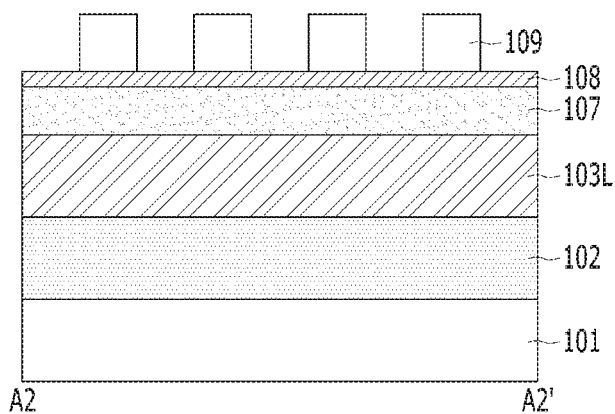
Figure 6C:
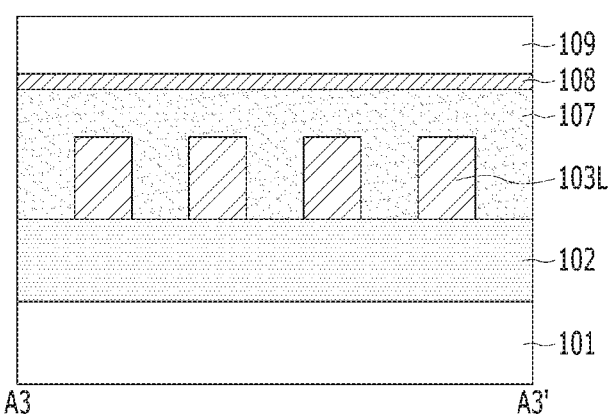
Figure 6D:
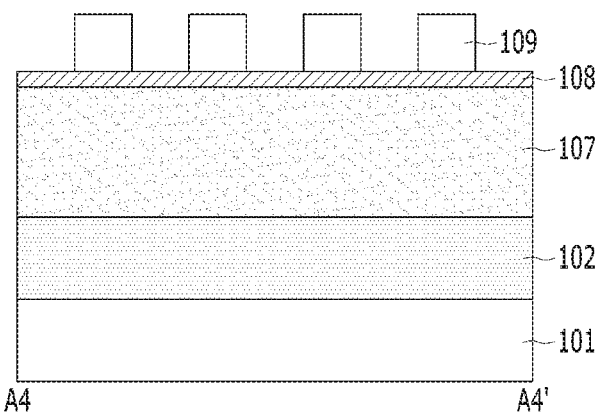

FIG. 6A is a cross-sectional view taken along a line A1-A1' of FIG. 2D, and FIG. 6B is a cross-sectional view taken along a line A2-A2' of FIG. 2D. FIG. 6C is a cross-sectional view taken along a line A3-A3' of FIG. 2D, and FIG. 6D is a cross-sectional view taken along a line A4-A4' of FIG. 2D.

Referring to FIGS. 2D, 6A, 6B, 6C, and 6D, a second mask material 108 may be formed over the second sacrificial material 107. The second mask material 108 and the first mask materials 105 may be made of the same material. The second mask material 108 may have an etch selectivity with respect to the second sacrificial material 107. The second mask material 108 may include, for example, oxynitride. The second mask material 108 may include silicon oxynitride (SiON). The second mask material 108 may be thinner than the second sacrificial material 107.

The second photoresist patterns 109 may be formed over the second mask material 108. The second photoresist patterns 109 may be formed by applying a photoresist onto the second mask material 108 and performing exposure and development. The second photoresist patterns 109 may have a line/space shape. The second photoresist patterns 109 may have a linear shape extending in a second direction D2. A plurality of spacings may be defined between the second photoresist patterns 109, and the surface of the second mask material 108 may be partially exposed by the spacings. The spacings may have a linear shape extending in one direction. The second photoresist patterns 109 may intersect with the first lines 103L. For example, the second photoresist patterns 109 and the first lines 103L may intersect with each other vertically.

Figure 2E:
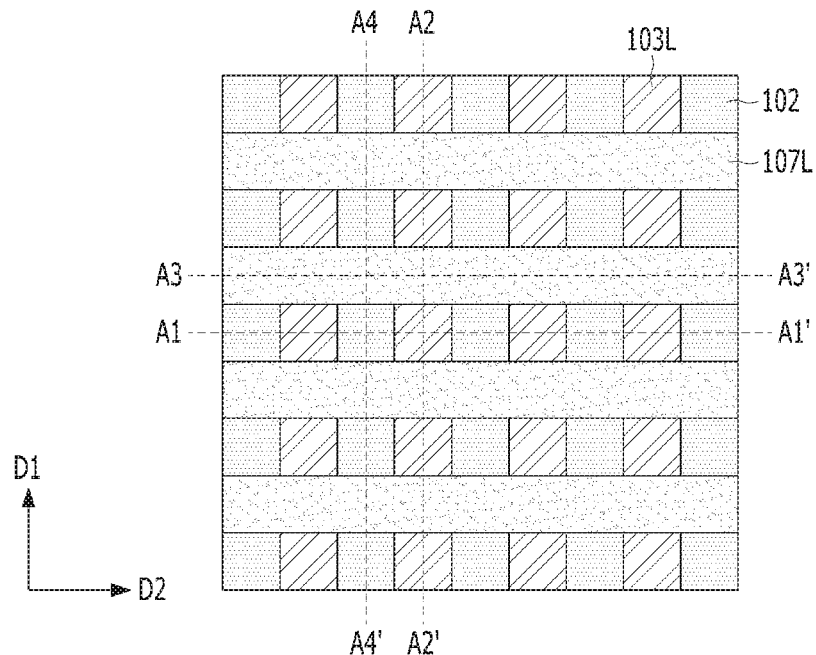
Figure 7A:
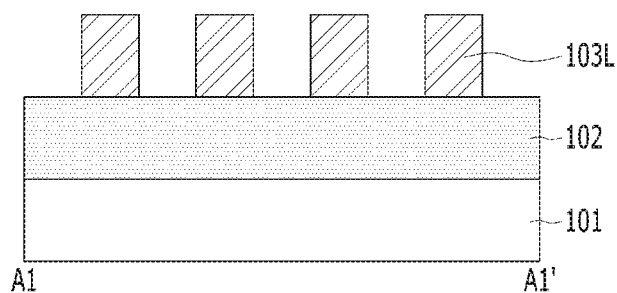
Figure 7B:
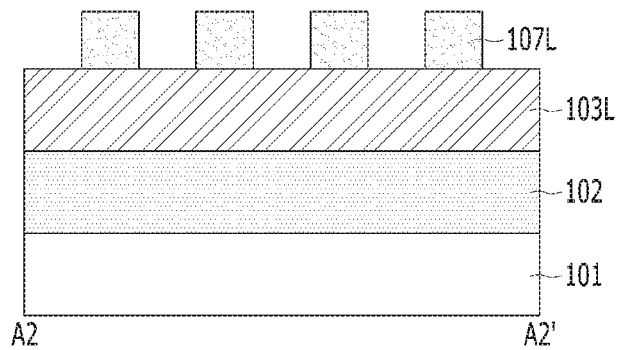
Figure 7C:
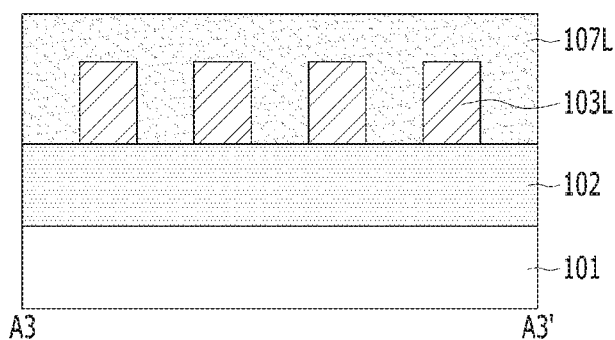
Figure 7D:
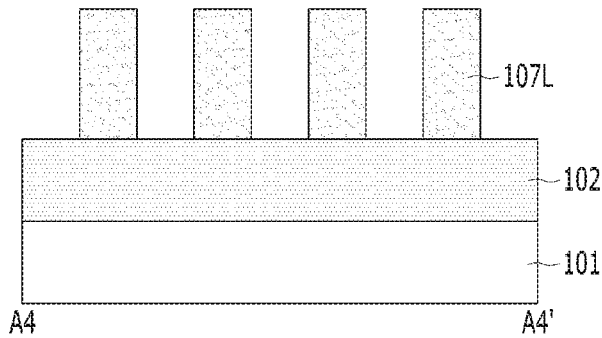

FIG. 7A is a cross-sectional view taken along a line A1-A1' of FIG. 2E, and FIG. 7B is a cross-sectional view taken along a line A2-A2' of FIG. 2E. FIG. 7C is a cross-sectional view along A3-A3' of FIG. 2E, and FIG. 7D is a cross-sectional view taken along a line A4-A4' of FIG. 2E.

Referring to FIGS. 2E, 7A, 7B, 7C, and 7D, a plurality of second lines 107L may be formed. The second lines 107L may be formed by etching the second sacrificial material 107. In order to form the second lines 107L, the second mask material 108 may be etched using the second photoresist patterns 109 as an etch barrier, and the second sacrificial material 107 may be etched using the etched second mask material 108 as an etch barrier.

The second lines 107L may have a linear shape extending in the second direction D2. The second lines 107L and the first lines 103L may intersect with each other. For example, the second lines 107L and the first lines 103L may intersect with each other vertically. A plurality of spacings may be defined between the second lines 107L, and the etch target material 102 and the first lines 103L may be partially exposed by the spacings.

From the perspective of a top view, the second lines 107L and the first lines 103L may intersect with each other vertically.

Figure 2F:
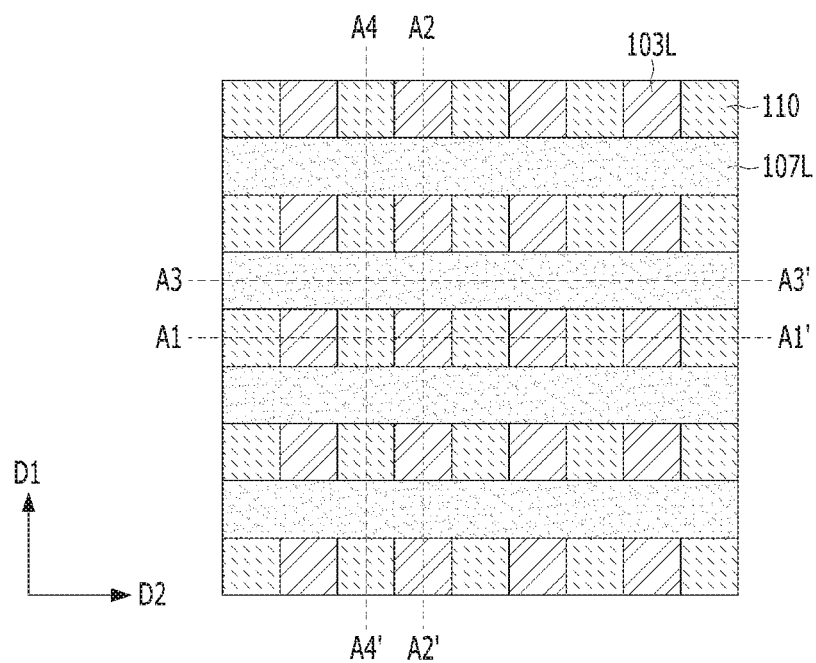
Figure 8A:
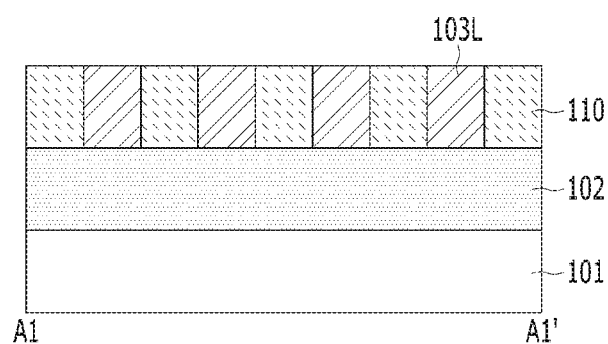
Figure 8B:
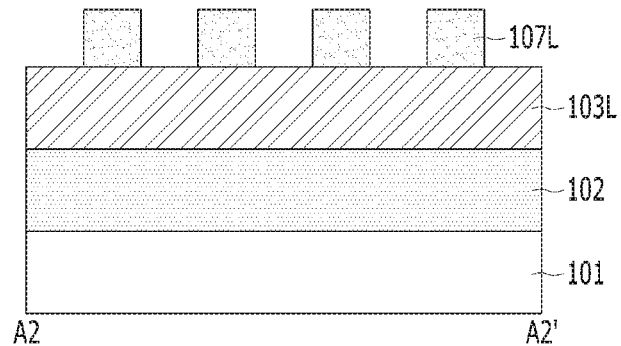
Figure 8C:
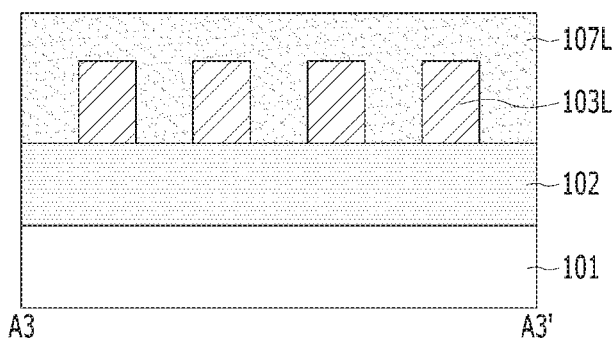
Figure 8D:
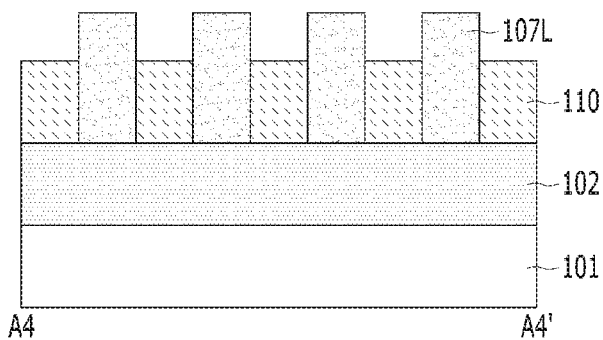

FIG. 8A is a cross-sectional view taken along a line A1-A1' of FIG. 2F, and FIG. 8B is a cross-sectional view taken along a line A2-A2' of FIG. 2F. FIG. 8C is a cross-sectional view taken along a line A3-A3' of FIG. 2F, and FIG. 8D is a cross-sectional view taken along a line A4-A4' of FIG. 2F.

Referring to FIGS. 2F, 8A, 86, 8C, and 8D, the second hard mask material 110 may gap-fill the spacings between the second lines 107L. The second hard mask material 110 may be formed to have an upper surface positioned at the same level as the first lines 103L. To this end, after gap-filling the spacings between the second lines 107L with the second hard mask material 110, the second hard mask material 110 may be etched back to expose the first lines 103L due to the spacings of the second lines 107L.

The second hard mask material 110 may include a material having an etch selectivity with respect to the first lines 103L. The second hard mask material 110 may include, for example, polysilicon. The polysilicon may have an etch selectivity with respect to the silicon oxide film.

From the perspective of a top view, as it can be seen from FIG. 2F, the first lines 103L and the second hard mask material 110 may be alternately disposed in the spacings between the second lines 107L.

Figure 2G:
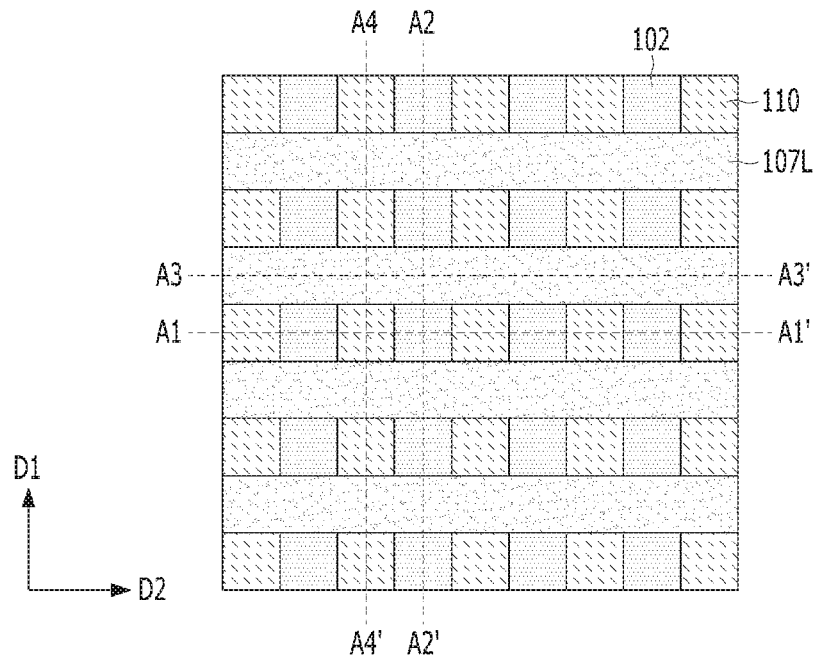
Figure 9A:
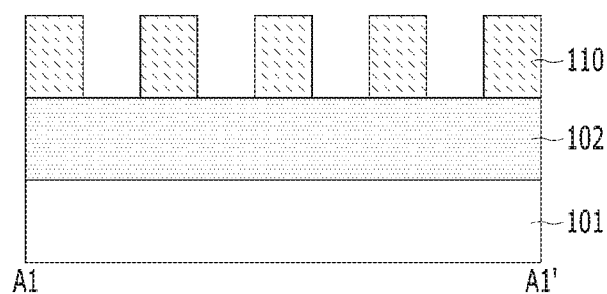
Figure 9B:
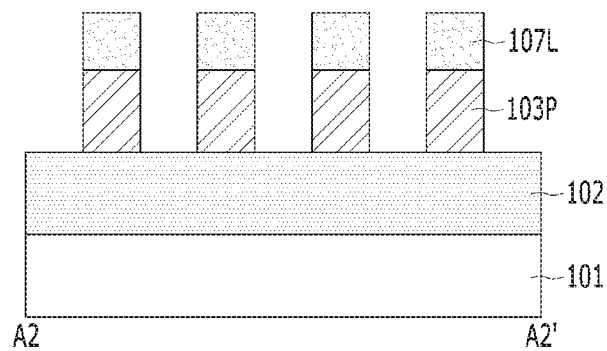
Figure 9C:
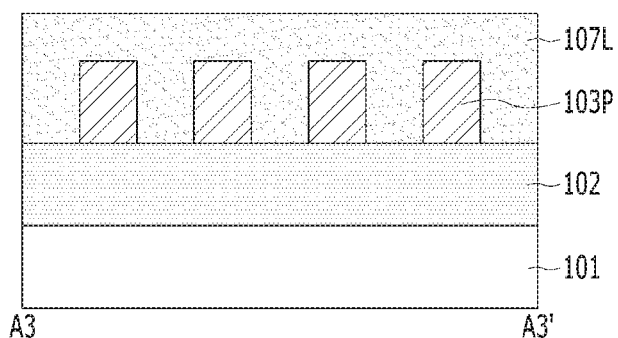
Figure 9D:
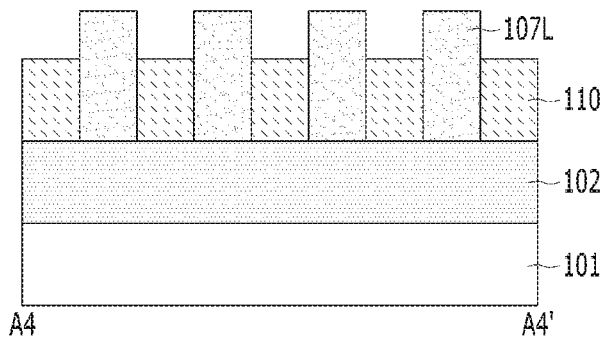

FIG. 9A is a cross-sectional view taken along a line A1-A1' of FIG. 2G, and FIG. 9B is a cross-sectional view taken along a line A2-A2' of FIG. 2G. FIG. 9C is a cross-sectional view taken along a line A3-A3' of FIG. 2G, and FIG. 9D is a cross-sectional view taken along a line A4-A4' of FIG. 2G.

Referring to FIGS. 2G, 9A, 9B, 9C, and 9D, the first lines 103L (refer to FIG. 8A) exposed between the second lines 107L may be selectively etched using the second lines 107L and the second hard mask material 110 as an etch mask. As a result, the first lines 103L (see FIG. 8C) that intersect with the second lines 107L and are not exposed, may remain to form a first island pattern 103P.

From the perspective of a top view, as shown in FIG. 2G, the etch target material 102 and the second hard mask material 110 may be alternately disposed in the spacings between the second lines 107L.

Figure 2H:
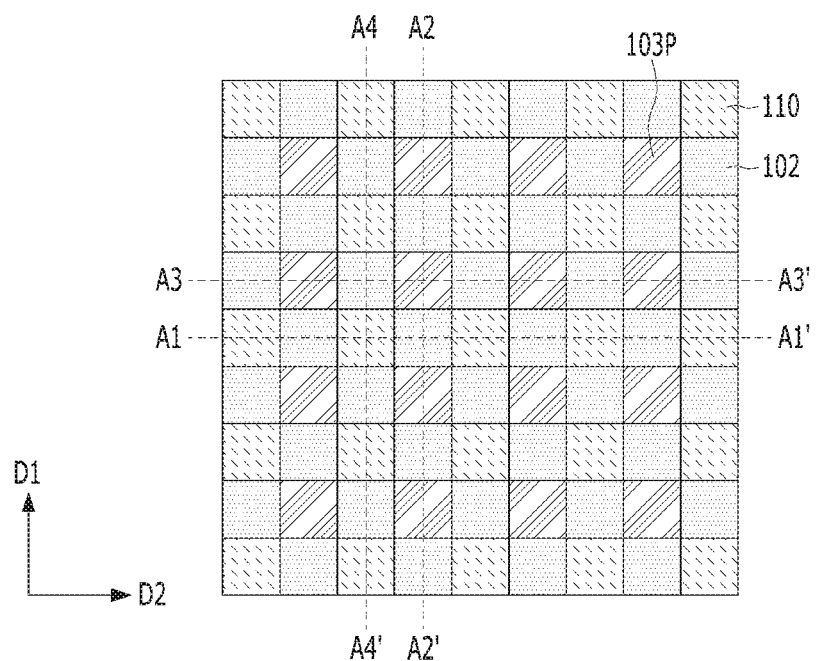
Figure 10A:
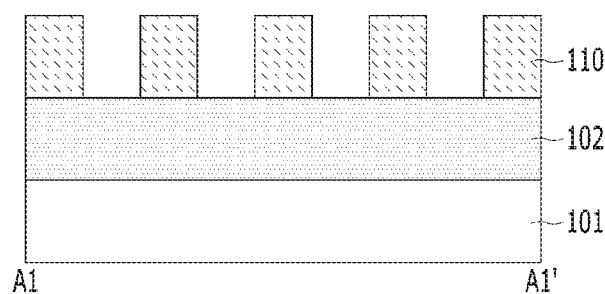
Figure 10B:
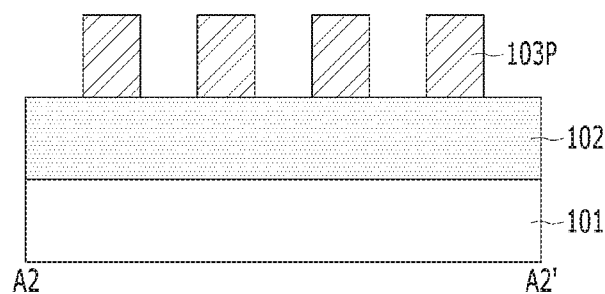
Figure 10C:
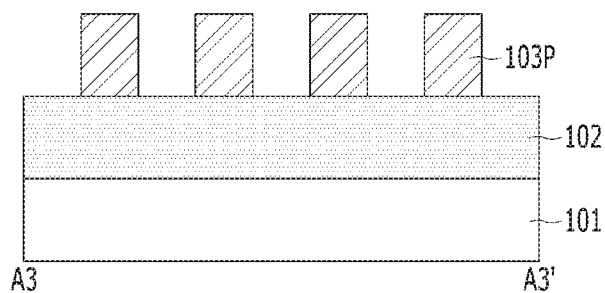
Figure 10D:
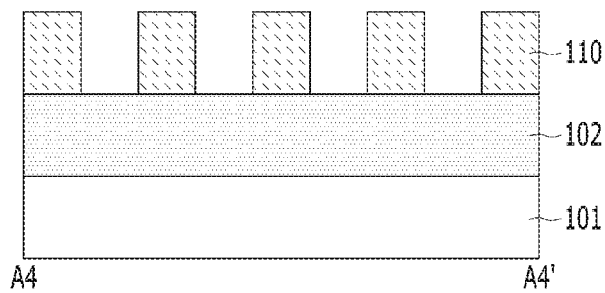

FIG. 10A is a cross-sectional view taken along a line A1-A1' of FIG. 2H, and FIG. 10B is a cross-sectional view taken along a line A2-A2' of FIG. 2H. FIG. 10C is a cross-sectional view taken along a line A3-A3' of FIG. 2H, and FIG. 10D is a cross-sectional view taken along a line A4-A4' of FIG. 2H.

Referring to FIGS. 2H, 10A, 10B, 10C, and 10D, the second lines 107L (see FIG. 9C) may be removed. The second lines 107L may be removed by a stripping process.

Referring to FIG. 2H a mesh structure in which the first island pattern 103P of an island shape and the second hard mask material 110 are alternately disposed in a diagonal direction may be formed over the etch target material 102.

Figure 2I:
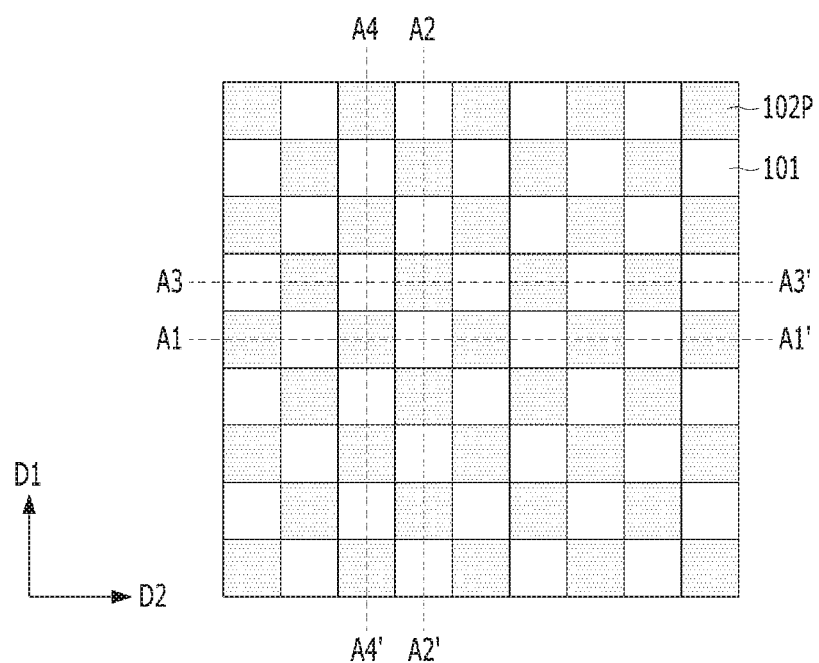
Figure 11A:
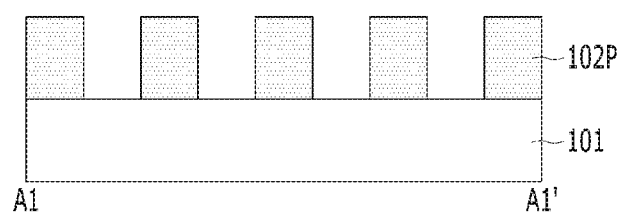
Figure 11B:
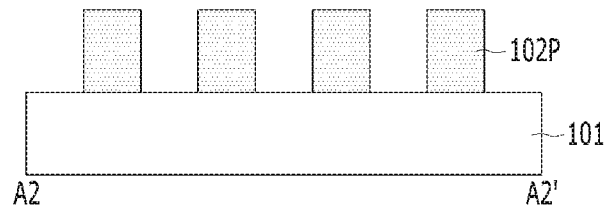
Figure 11C:
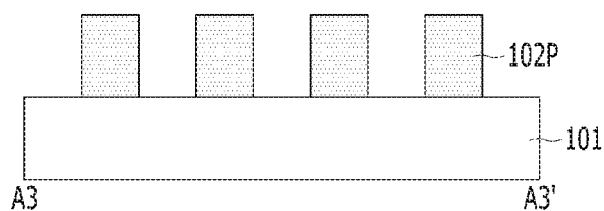
Figure 11D:
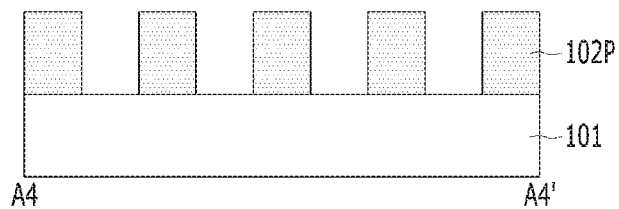

FIG. 11A is a cross-sectional view taken along a line A1-A1' of FIG. 2I, and FIG. 11B is a cross-sectional view taken along a line A2-A2' of FIG. 2I. FIG. 11C is a cross-sectional view taken along a line A3-A3' of FIG. 2I, and FIG. 11D is a cross-sectional view taken along a line A4-A4' of FIG. 2I.

Referring to FIGS. 2I, 11A, 11B, 11C, and 11D, the etch target material 102 (see FIG. 10A) may be etched using a double etch mask of the island-shaped first island pattern 103P and the second hard mask material 110. As a result, a plurality of island-shaped patterns 102P may be formed. The island-shaped pattern 102P may be arranged in a regular array with the same size and the same spacing.

The island-shaped patterns 102P may not be continuous.

According to another embodiment of the present invention, to form the island-shaped patterns 102P, tilt etching may be performed to form a continuous island-shaped pattern 102P with separated island-shaped openings.

According to the embodiment of the present invention, the reliability of the semiconductor device may be improved by improving the planarization characteristics of a gap-filling material.

While the present invention has been described with respect to specific embodiments, it will be apparent to those skilled in the art that various changes and modifications may be made without departing from the spirit and scope of the invention as defined in the following claims.

What is claimed is:

1. A method for forming a planarization layer, the method comprising:
    providing a substrate including a trench;
    coating a pre-thinner over a surface of the trench;
    forming a gap-filling material in the trench;
    coating a post-thinner over the gap-filling material; and
    performing a spinning process to rotate the substrate
    wherein the gap-filling material includes a carbon-containing material, and
    wherein the carbon-containing material includes a Spin On Carbon (SOC) or a photoresist.

2. The method of claim 1, wherein the forming of the gap-filling material in the trench is performed by spin coating.

3. The method of claim 1, further comprising:
    performing a baking process, after the coating a post-thinner over the gap-filling material.

4. A method for forming a pattern, the method comprising:
    forming first lines over an etch target material;
    forming a gap-filling material between the first lines, an upper surface of the gap-filling material being positioned at a higher level than an upper surface of at least the first lines;
    forming second lines in a direction intersecting with the first lines by etching the gap-filling material;

gap-filling a hard mask having an upper surface positioned at the same level as at least the first lines between the second lines;

etching the second lines and the first lines exposed by the hard mask;

removing the second lines; and forming a plurality of island-shaped openings separated from each other by etching the etch target material with the first lines and the hard mask, wherein a thinner coating is formed before and after the forming of the gap-filling material.

5. The method of claim 4, wherein the forming of the gap-filling material between the first lines includes:

coating a pre-thinner over the first lines;

forming a gap-filling material over the pre-thinner;

coating a post-thinner over the gap-filling material;

performing a spinning process to rotate the substrate; and performing a baking process.

6. The method of claim 5, wherein the forming of the gap-filling material between the first lines is performed by spin coating.

7. The method of claim 4, wherein the gap-filling material includes a carbon-containing material.

8. The method of claim 7, wherein the carbon-containing material includes SOC or a photoresist.

9. The method of claim 4, wherein the first lines and the second lines intersect with each other vertically.

10. The method of claim 4, wherein the second lines and the hard mask form an etch mask having a mesh structure.

11. The method of claim 4, wherein the forming of the first lines over the etch target material includes:

forming silicon oxide over the etch target material;

forming a mask material over the silicon oxide;

forming a line-type photoresist pattern over the mask material;

etching the mask material by using the photoresist pattern as an etch mask; and etching the hard mask material by using the mask material as an etch mask.

12. The method of claim 11, wherein the silicon oxide includes USG (Undoped Silicate Glass).

13. The method of claim 11, wherein the mask material includes a stacked structure of SOC and silicon oxynitride (SiON).

14. The method of claim 4, wherein the hard mask includes polysilicon.

15. A method for forming a planarization layer, the method comprising:

forming a trench in a substrate;

applying a first thinner over the substrate and a surface of the trench;

forming a gap-filling material over the first thinner in the trench;

performing a spinning process to rotate the substrate and planarize the gap-filling material; and removing the first thinner.

16. The method of claim 15, further comprising applying a second thinner over the gap-filling material before the spinning process is performed.

17. The method of claim 16, wherein the removing of the first thinner includes a baking process.

* * * * *